United States Patent [19]

Richardson

[11] Patent Number: 5,923,175
[45] Date of Patent: Jul. 13, 1999

[54] APPARATUS FOR CONTACTLESS MEASUREMENT OF THE ELECTRICAL RESISTANCE OF A CONDUCTOR

[75] Inventor: Robert E. Richardson, King George, Va.

[73] Assignee: The United States of America as represented by the Secretary of the Navy, Washington, D.C.

[21] Appl. No.: 08/869,320

[22] Filed: Jun. 3, 1997

[51] Int. Cl.$^6$ .................................................. G01R 27/26
[52] U.S. Cl. .......................... 324/637; 324/633; 324/632
[58] Field of Search .................................... 324/632, 633, 324/636, 637, 639

[56] References Cited

U.S. PATENT DOCUMENTS

| | | | |
|---|---|---|---|
| 4,885,527 | 12/1989 | Lacombe | 324/633 |
| 5,083,090 | 1/1992 | Sapsford et al. | 324/632 |
| 5,279,403 | 1/1994 | Harbaugh | 324/637 |
| 5,442,297 | 8/1995 | Verkuil | 324/683 |
| 5,554,935 | 9/1996 | Kraszewski | 324/637 |
| 5,748,003 | 5/1998 | Zoughi | 324/637 |

*Primary Examiner*—Maura Regan
*Attorney, Agent, or Firm*—James B. Bechtel, Esq.

[57] ABSTRACT

An apparatus for contactlessly measuring the electrical resistance per unit length of a low-resistance test conductor (e.g., wire or cable) at a selected measurement frequency, which includes a coaxial cavity structure having a central cavity region defined by opposed first and second outer conductor sections, and a center conductor, wherein the test conductor comprises the center conductor. An input probe disposed adjacent to the first one of the outer conductor sections launches a standing wave on the center conductor, and an output probe disposed adjacent to the second one of the outer conductor sections senses the Q of the central cavity region. A detector coupled to the output probe measures the sensed Q of the central cavity region. The electrical resistance per unit length of the test conductor at the selected measurement frequency can be determined from the measured cavity Q. Also disclosed is an apparatus for contactlessly measuring the electrical resistance per unit length of a high-resistance test conductor, which includes a coaxial transmission line structure having an outer conductor having a central low impedance propagation region and input and output high impedance regions adjacent to opposite ends of the propagation region, and a center conductor, wherein the test conductor comprises the center conductor. An input probe disposed in the input high impedance region launches a traveling wave on the center conductor. An output probe disposed in the output high impedance region senses the attenuation of the traveling wave after it has propagated through the propagation region. First and second ferrite trap sections disposed adjacent to the input and output high impedance regions, respectively, serve to minimize the corruption of electrical resistance measurements due to electrical and/or physical phenomena which may occur in the environment external to the apparatus. A detector coupled to the output probe measures the sensed attenuation of the traveling wave. The electrical resistance per unit length of the test conductor at a selected measurement frequency can be determined from the measured attenuation of the traveling wave.

20 Claims, 2 Drawing Sheets

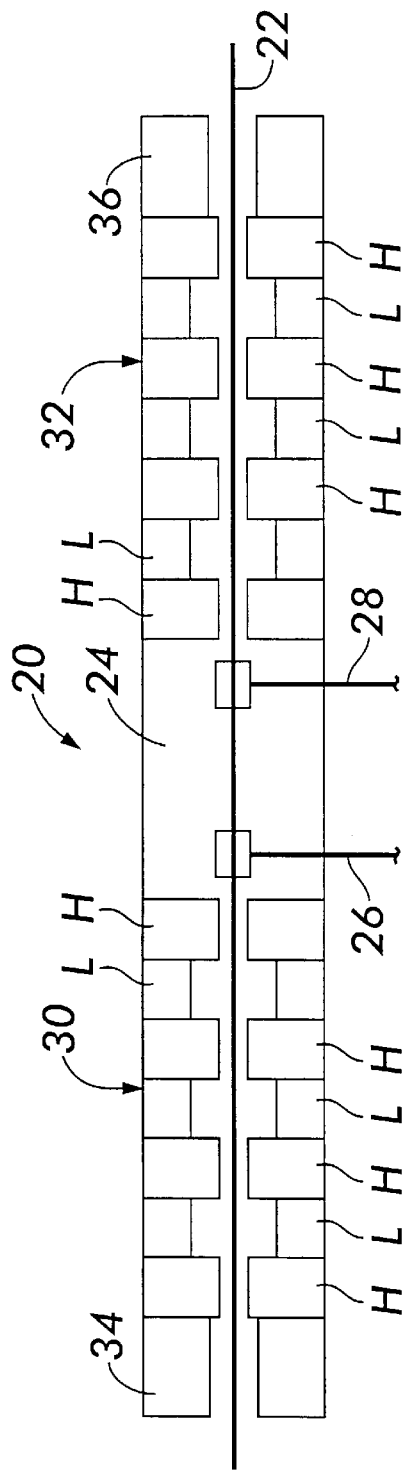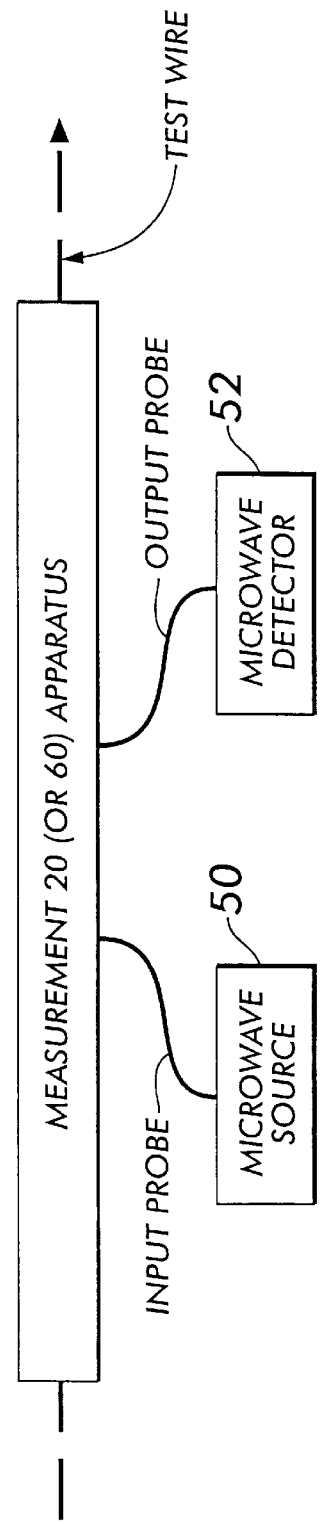

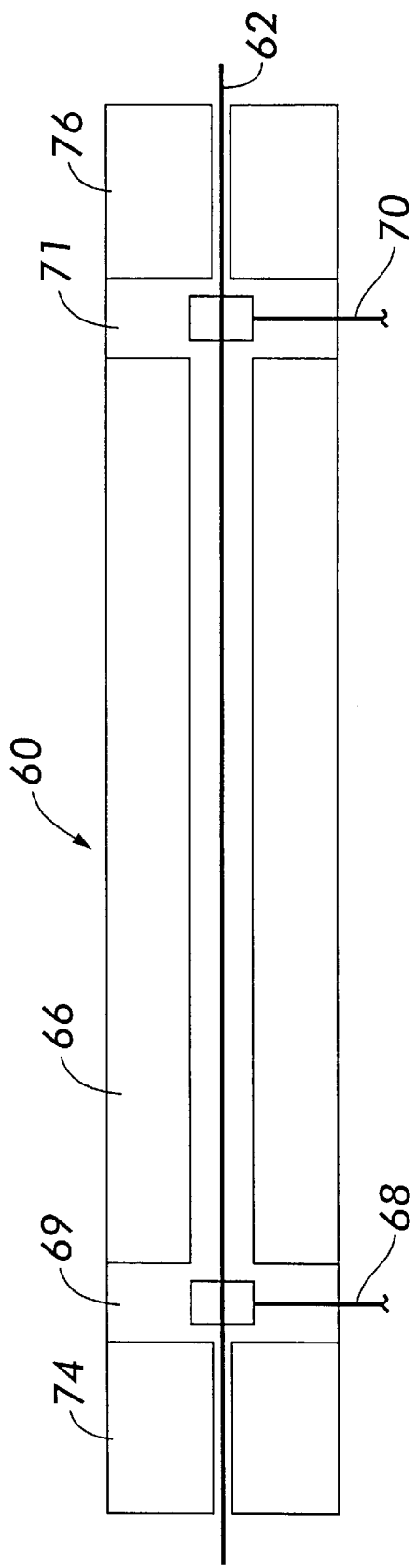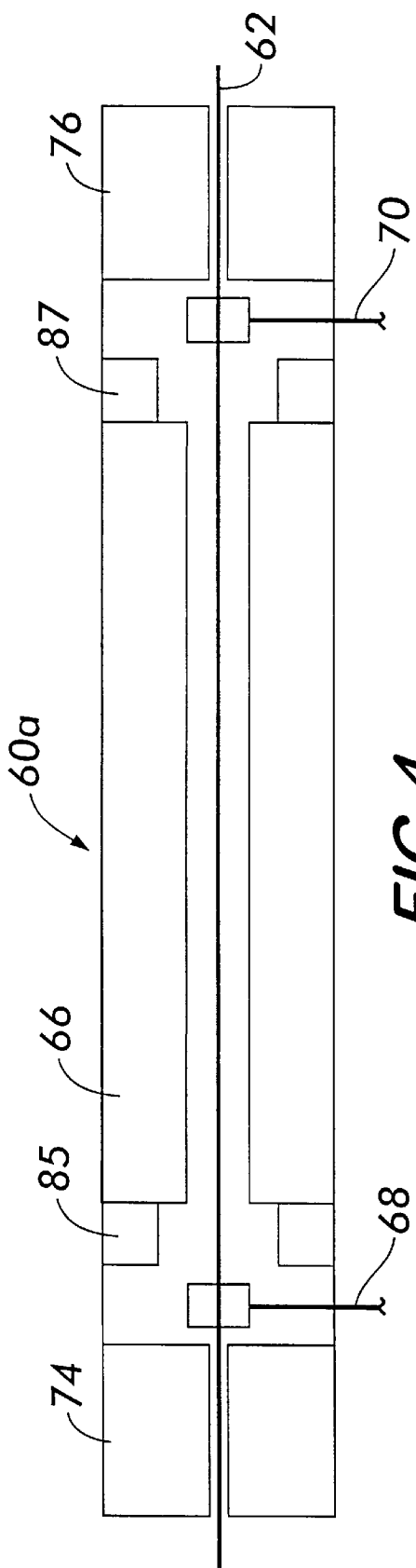

APPARATUS FOR CONTACTLESS MEASUREMENT OF THE ELECTRICAL RESISTANCE OF A CONDUCTOR

BACKGROUND OF THE INVENTION

The present invention relates generally to the field of apparatus for measuring the electrical resistance per unit length of a conductor, and more particularly, to an apparatus for measuring the electrical resistance of a conductor without physically contacting the conductor.

Conventional techniques for measuring the electrical resistance per unit length of a conductor (e.g., a wire or cable) entail the use of probes (e.g., 2- or 4-point probes) which are required to be in physical contact with the conductor. However, there are many applications in which it is inconvenient or undesirable to measure the electrical resistance of a conductor by measurement techniques which require such physical contact between the conductor and the test instrument. For example, physically contacting a conductor which is plated or coated with a conductive and/or dielectric protective material may be undesirable because of the risk of damaging or destroying the plating/coating. In this connection, in operations where the electrical resistance per unit length is regulated by controlling the plating thickness on a non-conductive substrate (as in the production of resistive chaff), measuring the electrical resistance per unit length by using a measurement technique which requires physical contact tends to be destructive to the plating and/or substrate material as a result of friction effects.

U.S. Pat. No. 5,083,090, issued to Sapsford et al., discloses a conctactless method for measuring the electrical resistance per unit length of a filament, such as a carbon-coated optical fiber, in which the filament is arranged as the inner conductor of a co-axial transmission line. The electrical resistance of the filament is determined by measuring a propagation characteristic of the co-axial transmission line. The transmission line may be divided into seven sections, with a signal injected on the second section, and a comparison of the resulting signals being used in a feedback loop to control the injected signal frequency in such a way as to hold constant either the relative amplitudes or the relative phases of the signals appearing at the fourth and sixth sections.

In addition to being unduly cumbersome, the Sapsford et al. test apparatus is susceptible to resistance measurement errors due to the adverse influence of physical and/or electrical disturbances in the environment external to the test apparatus which can corrupt the measurements. Further, the Sapsford et al. test apparatus is incapable of measuring the electrical resistance per unit length of low-resistance conductors, e.g., those having resistances less than about $2 \times 10^5$ $\Omega$/M. Moreover, the Sapsford et al. test apparatus is only capable of measuring the electrical resistance of a conductor for test signal frequencies less than 100 MHz, and is primarily designed to accurately measure the electrical resistance of a conductor for test signal frequencies in a frequency range of between 1 MHz to 4.5 MHz. Thus, the Sapsford et al. test apparatus is incapable of measuring the electrical resistance of a conductor at microwave test signal frequencies.

Based on the above and foregoing, it will be appreciated that there presently exists a need in the art for a an apparatus for measuring the electrical resistance of a conductor without physically contacting the conductor which overcomes the drawbacks and shortcomings of the Sapsford et al. apparatus. The present invention fulfills this need in the art.

SUMMARY OF THE INVENTION

In a first preferred embodiment, the present invention encompasses an apparatus for contactlessly measuring the electrical resistance per unit length of a low-resistance test conductor (e.g., wire or cable) at a selected measurement frequency, which includes a coaxial cavity structure having a central cavity region defined by opposed first and second outer conductor sections, and a center conductor, wherein the test conductor comprises the center conductor.

An input probe disposed adjacent to the first one of the outer conductor sections launches a standing wave on the center conductor, and an output probe disposed adjacent to the second one of the outer conductor sections senses the Q of the central cavity region. A detector coupled to the output probe measures the sensed Q of the central cavity region. The electrical resistance per unit length of the test conductor at the selected measurement frequency can be determined from the measured cavity Q.

In a second preferred embodiment, the present invention encompasses an apparatus for contactlessly measuring the electrical resistance per unit length of a high-resistance test conductor at a selected measurement frequency, which includes a coaxial transmission line structure having an outer conductor having a central low impedance propagation region and input and output high impedance regions adjacent to opposite ends of the propagation region, and a center conductor, wherein the test conductor comprises the center conductor.

An input probe disposed in the input high impedance region launches a traveling wave on the center conductor. An output probe disposed in the output high impedance region senses the attenuation of the traveling wave after it has propagated through the propagation region. First and second ferrite trap sections with lossy propagation disposed adjacent to the input and output high impedance regions, respectively, serve to minimize the corruption of electrical resistance measurements due to electrical and/or physical phenomena which may occur in the environment external to the apparatus. A detector coupled to the output probe measures the sensed attenuation of the traveling wave. The electrical resistance per unit length of the test conductor at the selected measurement frequency can be determined from the measured attenuation of the traveling wave.

BRIEF DESCRIPTION OF THE DRAWINGS

The above and other objects, features, and advantages of the present invention will become apparent from the following detailed description read in conjunction with the accompanying drawings, in which:

FIG. 1 is a cross-sectional view of a coaxial cavity structure constructed in accordance with a first preferred embodiment of the present invention;

FIG. 2 is a schematic block diagram of a contactless electrical resistance measurement apparatus in accordance with either the first or second preferred embodiment of the present invention, which depicts the basic operational configuration thereof, FIG. 3 is a cross-sectional view of a coaxial transmission line structure constructed in accordance with a second preferred embodiment of the present invention; and, FIG. 4 is a cross-sectional view of an alternative construction of the coaxial transmisson line structure constructed in accordance with the second preferred embodiment of the present invention.

DETAILED DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

With reference now to FIG. 1, there can be seen a cross-sectional view of a coaxial cavity structure 20 which constitutes an apparatus for non-contacting measurement of the electrical resistance per unit length of a conductor 22, e.g., a wire or cable (hereinafter referred to as the "test wire"), in accordance with a first preferred embodiment of the present invention. The test wire 22 is arranged as the center conductor of the coaxial cavity structure 20. The coaxial cavity structure 20 of the first preferred embodiment is designed to measure the electrical resistance per unit length of a "low-resistance" test wire, e.g., a test wire having an electrical resistance in a range of between 1–100 $\Omega$/M. The coaxial cavity structure 20 includes a central cavity region 24 located between an input probe 26 and an output probe 28; impedance transformation sections 30 and 32 on opposite sides of the cavity region 24; and, ferrite trap sections 34, 36 disposed at opposite ends of the coaxial cavity structure 20. The cavity region 24 preferably has a length of (n $\lambda$/2), and each of the impedance transformation sections 30 and 32 has a length of (2n+1)$\lambda$/4, where n is an integer, and $\lambda$ is the wavelength at the center operating frequency.

With additional reference now to FIG. 2, in operation, a microwave source 50 drives the input probe 26 to thereby induce a microwave standing wave on the test wire 22. The output probe 28 is coupled to a microwave detector 52 which measures and displays the cavity Q. The electrical resistance per unit length of the test wire 22 at a selected measurement (operating frequency) can be determined on the basis of the measured cavity Q. More particularly, the Q of the mode in the cavity region 24 varies inversely with the impedance at the ends of the cavity region 24 and resistance per unit length of the test wire (center conductor) 22 at the selected measurement frequency, in a manner well-known to those skilled in the pertinent art.

It will be appreciated that the input and output probes 26 and 28 may be either capacitive probes or directional coupling probes. The measurement or operating frequency is preferably in a range of between about 800 MHz to 2 GHz, and the output power from the microwave source is preferably greater than or equal to about 10 milliwatts.

A microwave standing wave can be supported in the cavity region 24 if the resistance of the test wire (center conductor) 22 is not too great (e.g., below about 100 $\Omega$/M), and if the impedance at the ends of the cavity region 24 is sufficiently low (e.g., below about 10 $\Omega$). The required low value of impedance at the ends of the cavity region 24 is achieved by making the characteristic impedance of the ferrite trap sections 34 and 36 sufficiently high (e.g., above about 200 $\Omega$). The high impedance of the ferrite trap sections 34 and 36 as seen by the impedance transformation sections 30 and 32, respectively, is transformed by alternating low-impedance and high-impedance quarter-wave sections H, L thereof to achieve a very low value of impedance (e.g., in a range of between about 1–10 $\Omega$) at the edges of the cavity region 24.

Additionally, propagation through the ferrite trap sections 34 and 36 is lossy, so that significant power does not escape from the coaxial cavity structure 20 along the test wire (center conductor) 22. Consequently, the measurement of cavity Q is completely unaffected by physical or electrical phenomena which may be present outside of the coaxial cavity structure 20, which constitutes a signficant advantage over the presently available technology.

With reference now to FIG. 3, there can be seen a cross-sectional view of a coaxial transmission line structure 60 which constitutes an apparatus for non-contacting measurement of the electrical resistance per unit length of a test wire 62, in accordance with a second preferred embodiment of the present invention. As in the first preferred embodiment, the test wire 62 is arranged as the center conductor of the coaxial structure. However, the coaxial transmission line structure 60 of the second preferred embodiment is designed to measure the electrical resistance ;per unit length of a "high-resistance" test wire, e.g., a test wire having an electrical resistance in a range of between 10 $\Omega$/M–$10^5$ $\Omega$/M., at a selected measurement frequency. More particularly, the coaxial transmission line structure 60 includes a low characteristic impedance section 66 located between an input probe 68 and an output probe 70, and ferrite trap sections 74, 76 disposed at opposite ends of the coaxial transmission line structure 60.

With additional reference to FIG. 2, in operation, the microwave source 50 drives the input probe 68 to induce a microwave traveling wave on the test wire 62. The output probe 70 is coupled to the microwave detector 52 which functions, in this embodiment, to measure the attenuation of the traveling wave which is launched by the input probe 68. Because the resistance of the test wire 62 is high in this embodiment, the attenuation of the traveling wave is easily measurable for a coaxial transmission line structure 60 of reasonable length. However, it is not feasible to use this technique to measure the electrical resistance of a low-resistance test wire because the required length of the coaxial cavity structure would be quite impractical. It is for this reason that the apparatus of the first preferred embodiment of the present invention depicted in FIG. 1 and described herinabove was developed.

In short, with the first preferred embodiment, a standing wave is induced and the cavity Q is measured in order to determine the electrical resistance per unit length of the test wire at the selected measurement frequency, whereas with the second preferred embodiment, a traveling wave is induced on the test wire and the attenuation of the traveling wave is measured in order to determine the electrical resistance per unit length of the test wire at the selected measurement frequency. In this connection, if the resistance per unit length of the test wire is too high, signficant attenuation occurs during propagation of the wave and resonant standing waves which require low loss propagation will not exist.

A wave launched by the input probe 68 in an input high impedance region 69 of the coaxial transmission line structure 60 of the second preferred embodiment exists as a traveling wave which is attenuated as it travels through the low characteristic impedance propagation region 66 in the device. The strength of the traveling wave after it has been attenuated by propagation through the propagation region 66 is sensed by the output probe 70 in an output high impedance region 71 of the coaxial transmission line structure 60 and measured by the microwave detector 52 coupled to the output probe 70. It will be appreciated that the amount of attenuation of the traveling wave increases as a function of the length of the propagation region 66 (i.e., the longer the propagation region 66, the greater the attenuation of the traveling wave), as long as the characteristic impedance of the propagation region 66 is sufficiently low (e.g., less than about 35 $\Omega$). Thus, the traveling wave is launched and sensed in high impedance regions of the coaxial transmission line structure 60 but propagated through a low impedance propagation region of the structure in order to increase the attenuation for a given length and resistance per unit length of the center conductor.

The ferrite traps 74 and 76 at the input and output ends of the coaxial transmission line structure 60 prevent significant energy from propagating out of the coaxial structure 60, and also minimize internal reflections which could otherwise corrupt the attenuation measurement. It will be appreciated that the input and output probes 68 and 70 may be either capacitive probes or directional coupling probes. Of course, capacitive probes induce waves traveling in both directions on the center conductor; if only one direction of propagation is desired or required, directional input and output probes can be used.

With reference now to FIG. 4, there can be seen an alternative construction of the coaxial transmission line structure of the second preferred embodiment of the present invention. More particularly, in the alternative construction, the coaxial transmission line structure 60a further includes quarter-wave ($\lambda$/4) impedance matching sections 85, 87 adjacent opposite ends of the low characteristic impedance propagation region 66 in order to further minimize unwanted internal reflections which could otherwise corrupt the attenuation measurements.

It will be appreciated from the above and foregoing that both the first and second preferred embodiments of the present invention facilitate an instantaneous and non-destructive (contactless) measurement of the electrical resistance per unit length of a test wire at a selected measurement frequency. It will be further appreciated that the test wire (center conductor) may be moved through the coaxial structure continuously during operation without any physical contact with electrodes or pulleys. This has particular utility for manufacturing process control where it is desired to precisely control the electrical resistance per unit length of the conductor being manufactured.

Further, it will be recognized that the first preferred embodiment of the present invention enables the contactless measurement of the electrical resistance per unit length of a low-resistance conductor, which is not at all possible with the presently available technology, e.g., the structure disclosed in the Sapsford et al. patent discussed hereinbefore.

Moreover, it will be understood that the ferrite traps of the coaxial structure of the contactless resistance measurement apparatus of both preferred embodiments of the present invention disclosed hereinabove serve to minimize the corruption of the electrical resistance measurements and therefore enhance the accuracy and reliability of the device relative to the presently available technology, e.g., the structure disclosed in the Sapsford et al. patent discussed hereinbefore.

Yet further, it will be understood that the contactless resistance measurement apparatus of both preferred embodiments of the present invention disclosed hereinabove enables the measurement of the electrical resistance of a conductor for a microwave test signal, e.g., for measurement frequencies in a frequency range of 800 MHz to 2 GHz, which is a much broader measurement frequency range than that of the Sapsford et al. test apparatus.

Although preferred embodiments of the present invention have been described in detail hereinabove, it should be clearly understood that many variations and/or modifications of the basic inventive concepts taught herein which may appear to those skilled in the pertinent art will still fall within the spirit and scope of the present invention as defined in the appended claims.

What is claimed is:

1. An apparatus for measuring the electrical resistance per unit length of a test conductor, comprising:
    a coaxial cavity structure having a central cavity region defined by opposed first and second outer conductor sections, and a center conductor, wherein the test conductor comprises the center conductor;
    an input probe disposed adjacent to the first one of the outer conductor sections for launching a standing wave on the center conductor;
    an output probe disposed adjacent to the second one of the outer conductor sections for sensing the Q of the central cavity region; and,
    a device coupled to the output probe for measuring the sensed Q of the central cavity region, wherein the electrical resistance per unit length of the test conductor at a selected measurement frequency can be determined from the measured cavity Q.

2. The apparatus as set forth in claim 1, wherein each of the first and second outer conductor sections is comprised of a plurality of alternating high-impedance and low-impedance quarter-wave sections.

3. The apparatus as set forth in claim 1, wherein the standing wave comprises a microwave standing wave.

4. The apparatus as set forth in claim 3, wherein the measurement frequency of the apparatus is between 800 MHz to 2 Ghz.

5. The apparatus as set forth in claim 1, further comprising a microwave source coupled to the input probe for driving the input probe.

6. The apparatus as set forth in claim 5, wherein the device coupled to the output probe comprises a microwave detector which measures and displays cavity Q.

7. The apparatus as set forth in claim 1, wherein the test conductor comprises a low-resistance test conductor.

8. The apparatus as set forth in claim 7, wherein the electrical resistance of the test conductor is between 0.1 to 100$\Omega$/M.

9. The apparatus as set forth in claim 1, wherein the test conductor comprises a wire.

10. The apparatus as set forth in claim 1, wherein the test conductor comprises a cable.

11. The apparatus as set forth in claim 1, further comprising first and second ferrite trap sections with lossy propagation disposed adjacent the first and second outer conductor sections, respectively.

12. The apparatus as set forth in claim 2, further comprising first and second ferrite trap sections with lossy propagation disposed adjacent the first and second outer conductor sections, respectively.

13. The apparatus as set forth in claim 12, wherein the length of the central cavity region is (n $\lambda$/2), and the length of each of the first and second impedance transformation sections is (2n+1)$\lambda$/4, where n is an integer, and $\lambda$ is the wavelength at the center operating frequency of the apparatus.

14. The apparatus as set forth in claim 1, wherein the length of the central cavity region is (n $\lambda$/2), where n is an integer, and $\lambda$ is the wavelength at the center operating frequency of the apparatus.

15. The apparatus as set forth in claim 1, wherein the characteristic impedance of each of the first and second ferrite trap sections is greater than about 200 $\Omega$.

16. An apparatus for measuring the electrical resistance per unit length of a test conductor, comprising:

a coaxial transmission line structure having an outer conductor having a central low impedance propagation region and input and output high impedance regions adjacent to opposite ends of the propagation region, and a center conductor, wherein the test conductor comprises the center conductor;

an input probe disposed in the input high impedance region for launching a traveling wave on the center conductor;

an output probe disposed in the output high impedance region for sensing the attenuation of the traveling wave after it has propagated through the propagation region;

first and second ferrite trap sections with lossy propagation disposed adjacent to the input and output high impedance regions, respectively; and, a device coupled to the output probe for measuring the sensed attenuation of the traveling wave, wherein the electrical resistance per unit length of the test conductor at a selected measurement frequency can be determined from the measured attenuation of the traveling wave.

17. The apparatus as set forth in claim 16, wherein the characteristic impedance of each of the first and second ferrite trap sections is 100–300 ohms.

18. The apparatus as set forth in claim 17, wherein the characteristic impedance of the propagation region is less than about 50 ohms.

19. The apparatus as set forth in claim 16, further comprising first and second quarter-wave impedance matching sections disposed adjacent to opposite ends of the propagation region for minimizing internal reflections within the coaxial transmission line structure.

20. The apparatus as set forth in claim 16, wherein the electrical resistance of the test conductor is between $100-10^5$ $\Omega$/M at the selected measurement frequency.

* * * * *